(12) United States Patent
Kim et al.

(10) Patent No.: US 10,677,968 B2
(45) Date of Patent: Jun. 9, 2020

(54) DISPLAY DEVICE METHOD FOR MANUFACTURING THE SAME AND HEAD MOUNTED DISPLAY DURING THE SAME

(71) Applicant: LG Display Co., Ltd., Seoul (KR)

(72) Inventors: JongSung Kim, Paju-si (KR); ChoongKeun Yoo, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/705,615

(22) Filed: Sep. 15, 2017

(65) Prior Publication Data

US 2018/0095195 A1    Apr. 5, 2018

(30) Foreign Application Priority Data

Sep. 30, 2016  (KR) .................. 10-2016-0127055

(51) Int. Cl.
| | |
|---|---|
| G02B 5/00 | (2006.01) |
| G02B 27/01 | (2006.01) |
| H01L 51/52 | (2006.01) |
| G02B 5/20 | (2006.01) |
| H01L 27/32 | (2006.01) |
| G02F 1/1362 | (2006.01) |
| G02F 1/1335 | (2006.01) |

(52) U.S. Cl.
CPC ............ *G02B 5/003* (2013.01); *G02B 5/201* (2013.01); *G02B 27/0172* (2013.01); *H01L 27/322* (2013.01); *H01L 27/3246* (2013.01); *H01L 51/5284* (2013.01); *G02B 2027/0112* (2013.01); *G02F 1/133512* (2013.01); *G02F 1/136209* (2013.01); *H01L 27/3213* (2013.01); *H01L 27/3244* (2013.01); *H01L 27/3272* (2013.01)

(58) Field of Classification Search
None
See application file for complete search history.

(56) References Cited

U.S. PATENT DOCUMENTS

| | | | | |
|---|---|---|---|---|
| 2006/0187393 | A1* | 8/2006 | Kuan ................. | G02F 1/133514 349/130 |
| 2012/0062824 | A1* | 3/2012 | Lee ................... | G02F 1/133514 349/109 |
| 2014/0168584 | A1* | 6/2014 | Lee ................... | G02F 1/133512 349/106 |
| 2015/0131015 | A1* | 5/2015 | Yamakawa ....... | G02F 1/133512 349/41 |
| 2015/0349030 | A1* | 12/2015 | Ono .................... | H01L 51/5284 257/40 |
| 2017/0102487 | A1* | 4/2017 | Lee ........................ | G02B 5/206 |
| 2017/0255015 | A1* | 9/2017 | Geng .................. | G02B 5/3083 |

FOREIGN PATENT DOCUMENTS

| | | |
|---|---|---|
| KR | 2016-0024963 A | 3/2016 |
| KR | 10-2016-0065618 A | 6/2016 |
| KR | 10-2016-0110621 A | 9/2016 |

\* cited by examiner

*Primary Examiner* — Erik Kielin
(74) *Attorney, Agent, or Firm* — Polsinelli PC

(57) ABSTRACT

A display device, a method for manufacturing the same, and a head mounted display including the same are disclosed, in which mixing of colors may be avoided. The display device comprises a black matrix covering an edge of a first color filter and a second color filter an edge of the black matrix.

19 Claims, 14 Drawing Sheets

DISPLAY DEVICE METHOD FOR MANUFACTURING THE SAME AND HEAD MOUNTED DISPLAY DURING THE SAME

CROSS REFERENCE TO RELATED APPLICATION

This application claims the benefit of the Korean Patent Application No. 10-2016-0127055 filed on Sep. 30, 2016, which is hereby incorporated by reference for all purposes as if fully set forth herein.

BACKGROUND

Field of the Disclosure

The present disclosure relates to a display device, and more particularly, to a display device, a method for manufacturing the same, and a head mounted display including the same.

Description of the Background

Recently, with the advancement of the information age, a demand for a display device for displaying an image has been increased in various forms. Therefore, various display devices such as liquid crystal display (LCD) devices, plasma display panel (PDP) devices, and organic light emitting display (OLED) devices have been utilized.

Among the display devices, the organic light emitting display device is a self-light emitting device, and has advantages in that a viewing angle and a contrast ratio are better than those of the liquid crystal display (LCD) device. Also, since the organic light emitting display device does not require a separate backlight, it is advantages that the organic light emitting display device is able to be thin and lightweight and has low power consumption. Furthermore, the organic light emitting display device has advantages in that it may be driven at a low direct current voltage, has a fast response speed, and especially has a low manufacturing cost.

The organic light emitting display device includes anode electrodes, a bank partitioning the anode electrodes, a hole transporting layer formed on the anode electrodes, an organic light emitting layer, an electron transporting layer, and a cathode electrode formed on the electron transporting layer. In this case, if a high potential voltage is applied to the anode electrode and a low potential voltage is applied to the cathode electrode, holes and electrons are moved to the organic light emitting layer through the hole transporting layer and the electron transporting layer, respectively, and are combined with each other in the organic light emitting layer to emit light.

The organic light emitting diode may include red, green and blue organic light emitting diodes emitting red light, green light and blue light, or may include only a white organic light emitting diode emitting white light. If the organic light emitting diode includes only a white organic light emitting diode, red, green and blue color filters for displaying red, green and blue are required.

Recently, a head mounted display which includes the organic light emitting display device described as above has been developed. The head mounted display (HMD) is a type monitor device of virtual reality (VR), which can be worn by a user in the form of glasses or helmet, and of which focus is formed at a distance close to eyes of the user. However, in case of a head mounted display of ultra-high resolution, one or more color filters may be formed to overlap each other due to a compact pixel interval, and light may transmit an area where the color filters are formed to overlap each other, whereby mixing of colors may occur.

FIG. 1 is a schematic view illustrating a display device where mixing of colors occurs. In FIG. 1, for convenience of description, anode electrodes AND, an organic light emitting layer OL, a cathode electrode CAT, a bank, a black matrix BM and first and second color filters CF1 and CF2 are shown.

As illustrated by FIG. 1, light L transmits an area where first and second color filters CF1 and CF2 formed to overlap each other on a black matrix BM. In FIG. 1, the black matrix BM fails to cover the overlapped area of the first and second color filters CF1 and CF2. Therefore, mixing of colors occurs due to light L passing through the overlapped area of the first and second color filters CF1 and CF2.

SUMMARY

Accordingly, the present disclosure is directed to a display device, a method for manufacturing the same, and a head mounted display including the same, which substantially obviate one or more problems due to limitations and disadvantages of the related art.

An advantage of the present disclosure is to provide a display device, a method for manufacturing the same, and a head mounted display including the same, in which mixing of colors may be avoided.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device comprising a black matrix covering an edge of a first color filter and a second color filter an edge of the black matrix which covers the edge of the first color filter, a method for manufacturing the display device, and a head mounted display including the same.

In the display device according to one aspect of the present disclosure, the black matrix is arranged to cover an edge of the first color filter, whereby light emitted from the organic light emitting diode and then passed through the first color filter may be prevented from entering the second color filter or light passed through the second color filter may be prevented from entering the first color filter.

In the display device according to one aspect of the present disclosure, even though color filters may be formed to overlap each other due to a compact pixel interval in a head mounted display of ultra-high resolution, mixing of colors in light may be prevented from occurring and picture image quality may be prevented from being deteriorated.

It will be appreciated by persons skilled in the art that that the effects that can be achieved through the present disclosure are not limited to what has been particularly described hereinabove and other advantages of the present disclosure will be more clearly understood from the following detailed description.

BRIEF DESCRIPTION OF THE DRAWINGS

The accompanying drawings, which are included to provide a further understanding of the present disclosure and are incorporated in and constitute a part of this disclosure, illustrate aspect(s) of the disclosure and together with the description serve to explain the principle of the disclosure.

In the drawings.

DETAILED DESCRIPTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a display device, a method for manufacturing the same, and a head mounted display including the same according to the present disclosure will be described in detail with reference to the accompanying drawings. Wherever possible, the same reference numbers will be used throughout the drawings to refer to the same or like parts. Also, in the following description of the present disclosure, if detailed description of elements or functions known in respect of the present disclosure is determined to make the subject matter of the present disclosure unnecessarily obscure, the detailed description will be omitted.

Hereinafter, the preferred aspect of the present disclosure will be described with reference to the accompanying drawings.

Figure 1:
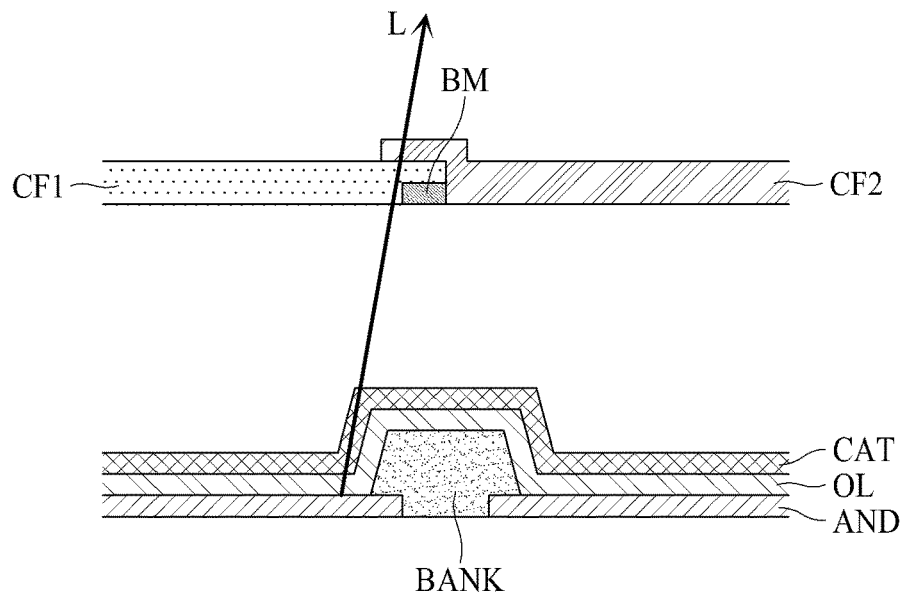
FIG. 1 is a detailed exemplary view illustrating a display device where mixing of colors occurs according to the related art.
Figure 2:
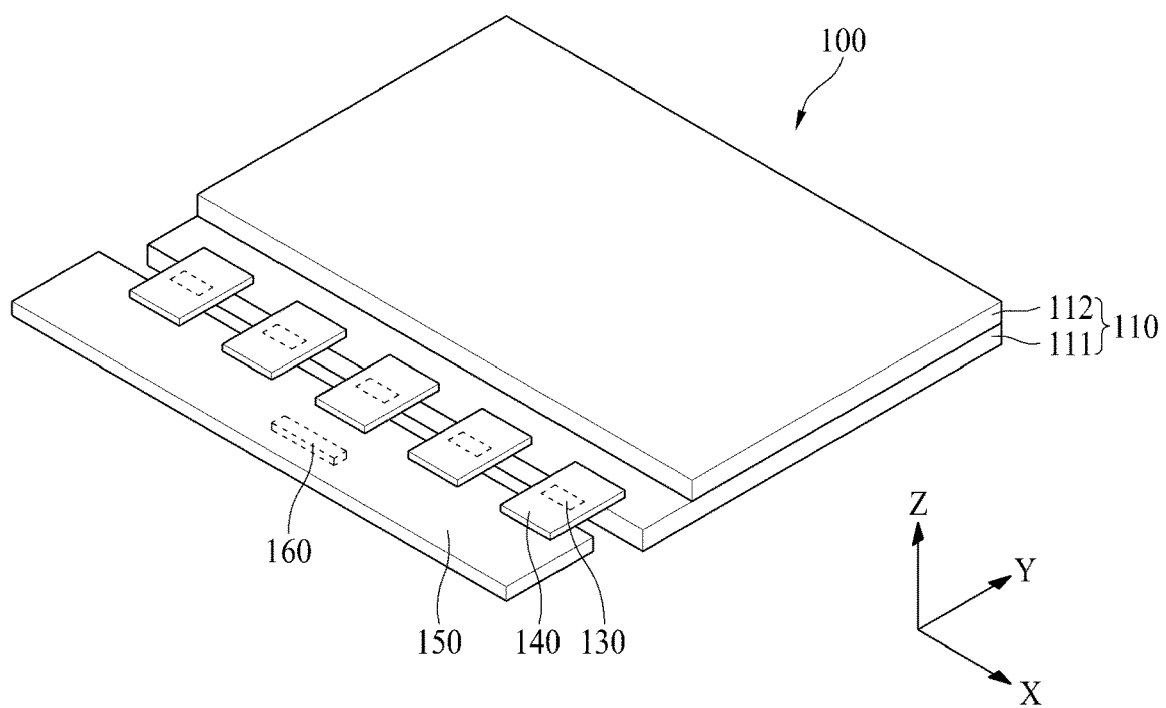
FIG. 2 is a perspective view illustrating a display device according to an aspect of the present disclosure.
Figure 3:
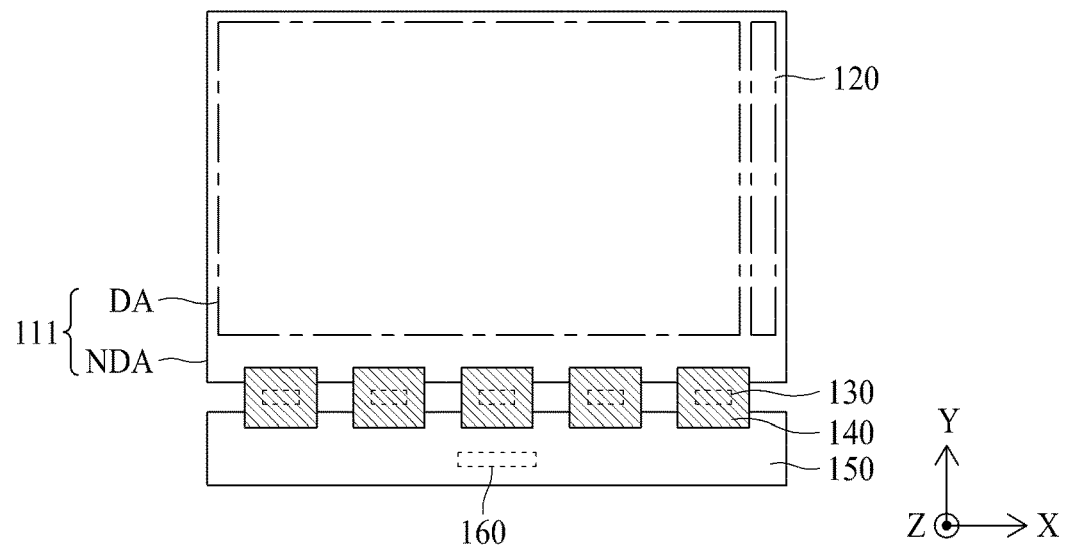
FIG. 3 is a plan view illustrating a first substrate, a gate driver, a source drive IC, a flexible film, a circuit board, and a timing controller of FIG. 2.

FIG. 2 is a perspective view illustrating a display device according to an aspect of the present disclosure. FIG. 3 is a plan view illustrating a first substrate, a gate driver, a source drive IC, a flexible film, a circuit board, and a timing controller of FIG. 2. Hereinafter, the display device according to an aspect of the present disclosure, which will be described, is, but not limited to, an organic light emitting display device. That is, the display device according to an aspect of the present disclosure may be realized as any one of a liquid crystal display device, a field emission display device or an electrophoresis display device.

Referring to FIGS. 2 and 3, the display device 100 according to an aspect of the present disclosure includes a display panel 110, a gate driver 120, a source drive integrated circuit (hereinafter, referred to as "IC") 130, a flexible film 140, a circuit board 150, and a timing controller 160.

The display panel 110 includes a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film.

Gate lines, data lines and pixels are formed on one surface of the first substrate 111, which faces the second substrate 112. The pixels are provided in an area defined by a crossing structure of the gate lines and the data lines.

Each of the pixels may include an organic light emitting diode that includes a thin film transistor, a first electrode, an organic light emitting layer, and a second electrode. Each of the pixels supplies a predetermined current to the organic light emitting diode in accordance with a data voltage of the data line if a gate signal is input from the gate line by using the thin film transistor. For this reason, the organic light emitting diode of each of the pixels may emit light with a predetermined brightness in accordance with the predetermined current. A structure of each of the pixels will be described later with reference to FIGS. 4 to 8.

The display panel 110 may be divided into a display area DA where the pixels are formed to display an image and a non-display area NDA where an image is not displayed, as shown in FIG. 3. The gate lines, the data lines and the pixels may be formed on the display area DA. The gate driver 120 and pads may be formed on the non-display area NDA.

The gate driver 120 supplies gate signals to the gate lines in accordance with a gate control signal input from the timing controller 170. The gate driver 120 may be formed on the non-display area NDA outside one side or both sides of the display area DA of the display panel 110 in a gate driver in panel (GIP) mode. Alternatively, the gate driver 120 may be formed of a driving chip, packaged in a flexible film and attached to the non-display area NDA outside one side or both sides of the display panel 110 in a tape automated bonding (TAB) mode.

The source drive IC 130 receives digital video data and a source control signal from the timing controller 160. The source drive IC 130 converts the digital video data to analog data voltages in accordance with the source control signal and supplies the analog data voltages to the data lines. If the source drive IC 130 is formed of a driving chip, the source drive IC 140 may be packaged in the flexible film 140 in a chip on film (COF) or chip on plastic (COP) mode.

Pads such as data pads may be formed on the non-display area NDA of the display panel 110. Lines which connect the pads with the source drive IC 130 and lines which connect the pads with lines of the circuit board 150 may be formed in the flexible film 140. The flexible film 140 may be attached onto the pads by an anisotropic conducting film (ACF), whereby the pads may be connected with the lines of the flexible film 140.

The circuit board 150 may be attached to the flexible films 140. A plurality of circuits comprised of driving chips may be packaged in the circuit board 150. For example, the timing controller 160 may be packaged in the circuit board 150. The circuit board 150 may be a printed circuit board or a flexible printed circuit board.

The timing controller 160 receives digital video data and a timing signal from an external system board through a cable. The timing controller 160 generates a gate control signal for controlling an operation timing of the gate driver 120 and a source control signal for controlling the source drive ICs 130 on the basis of the timing signal. The timing controller 160 supplies the gate control signal to the gate driver 120, and supplies the source control signal to the source drive ICs 130.

Figure 4:
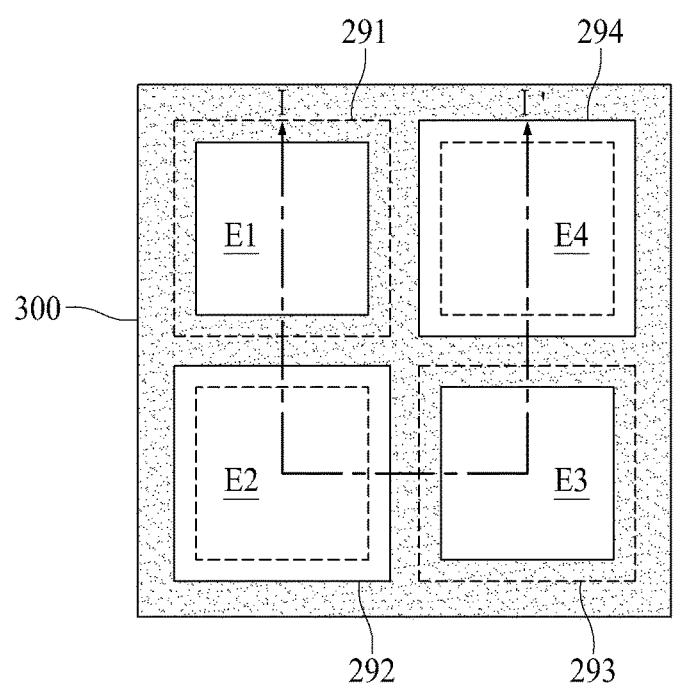
FIG. 4 is a plan view illustrating an example of pixels of a display area.

FIG. 4 is a plan view illustrating an example of pixels of a display area. For convenience of description, emission areas E1, E2, E3 and E4, color filters 291, 292, 293 and 294 and a black matrix 300 of pixels are only shown in FIG. 4.

Referring to FIG. 4, each of the emission areas E1, E2, E3 and E4 indicates an area where a first electrode corresponding to an anode electrode, an organic light emitting layer, and a second electrode corresponding to a cathode electrode are sequentially deposited and holes from the first electrode are combined with electrons from the second electrode in the organic light emitting layer to emit light. The organic light emitting layer of the emission areas E1, E2, E3 and E4 is formed on the emission areas E1, E2, E3 and E4 as a common layer to emit white light. The first emission area E1 and the third emission area E3 according to one aspect are arranged in a first diagonal direction, and the second emission area E2 and the emission area E4 are arranged in a second diagonal direction crossing the first diagonal direction.

The first color filter 291 is arranged to correspond to the first emission area E1, and the second color filter 292 is arranged to correspond to the second emission area E2. Also, the third color filter 293 is arranged to correspond to the third emission area E3, and the fourth color filter 294 is arranged to correspond to the fourth emission area E4.

In the pixels according to one aspect of the present disclosure, color filters of the same color are not arranged at adjacent pixels. Therefore, the first color filter 291 according to one aspect of the present disclosure may have a color different from those of the second color filter 292 and the fourth color filter 294, and may have the same color as that of the third color filter 293. Also, the second color filter 292 may have a color different from those of the first color filter 291 and the third color filter 293, and may have the same color as that of the fourth color filter 294.

The second color filter 292 and the fourth color filter 294 according to one aspect may be green color filters, the third color filter 293 may be a blue color filter, and the first color filter 291 may be a red color filter. For this reason, the second emission area E2 and the fourth emission area E4 may emit, but not limited to, green light by means of the second color filter 292 and the fourth color filter 294, the third emission area E3 may emit, but not limited to, blue light by means of the third color filter 293, and the first emission area E1 may emit, but not limited to, red light by means of the first color filter 291.

In FIG. 4, a red sub pixel emitting red light, a green sub pixel emitting green light, and a blue sub pixel emitting blue light may be defined as one unit pixel. However, the aspect of the present disclosure is not limited to the aspect of FIG. 4, and one unit pixel may further include a sub pixel emitting another colored light.

The black matrix 300 partitions the color filters 291, 292, 293 and 294. To this end, the black matrix 300 is arranged among the color filters 291, 292, 293 and 294. The black matrix 300 has a height higher than those of the first color filter 291 and the third color filter 293, and each of the second color filter 292 and the fourth color filter 294 has a height higher than that of the black matrix 300. In more detail, the black matrix 300 according to one aspect of the present disclosure covers edges of the first color filter 291 and the third color filter 293, and partitions the first color filter 291 and the third color filter 293. Also, the black matrix 300 according to one aspect of the present disclosure is arranged below the edges of the second color filter 292 and the fourth color filter 294, and partitions the second color filter 292 and the fourth color filter 294. That is, the black matrix 300 according to one aspect of the present disclosure covers the edges of the first color filter 291 and the third color filter 293, and the second color filter 292 and the fourth color filter 294 cover the edge of the black matrix 300. Therefore, the color filters 291, 292, 293 and 294 according to one aspect of the present disclosure do not adjoin their adjacent color filters 291, 292, 293 and 294, and the black matrix 300 is arranged among the adjacent color filters 291, 292, 293 and 294 even though the adjacent color filters 291, 292, 293 and 294 overlap one another, whereby mixing of colors can be avoided.

In the sub pixels according to one aspect of the present disclosure as described above, the same structure is provided between the sub pixels facing in a diagonal direction, and a different structure is provided between the sub pixels adjacent to each other. Therefore, the display device according to one aspect of the present disclosure may prevent light passing through the color filters of different colors, which are arranged to adjoin each other, at one time from occurring, and picture image quality can be prevented from being deteriorated.

Figure 5:
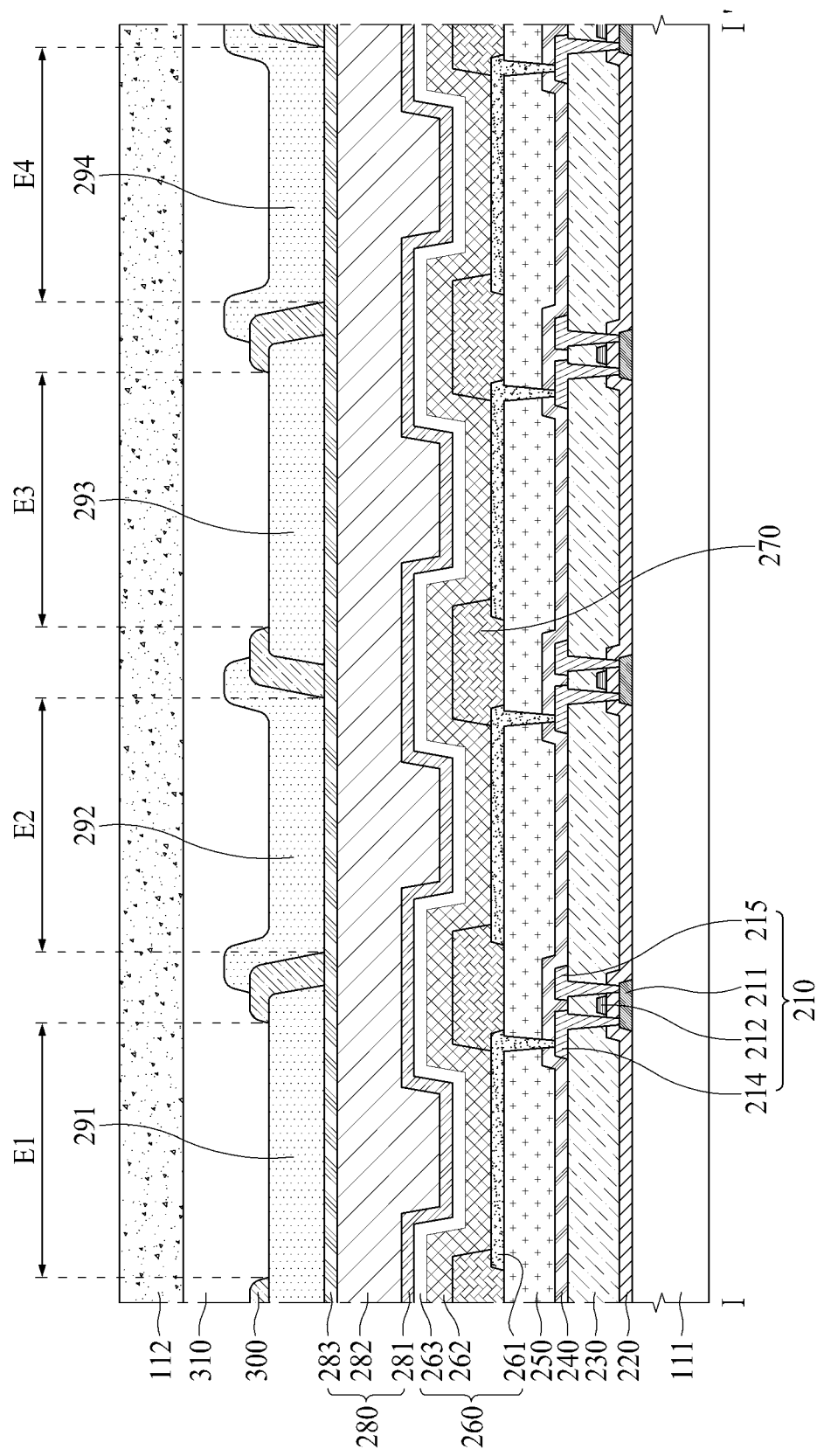
FIG. 5 is a cross-sectional view taken along line I-I' of FIG. 4.

FIG. 5 is a cross-sectional view illustrating an example of I-I' of FIG. 4.

Referring to FIG. 5, a buffer film may be formed on the first substrate 111 which faces the second substrate 112. The buffer film may be formed on one surface of the first substrate 111 to protect the thin film transistors 210 and the organic light emitting diodes 260 from water permeated through the first substrate 111 which is vulnerable to moisture permeability. The buffer film may be made of a plurality of inorganic films which are deposited alternately. For example, the buffer film may be formed of a multi-layered film of one or more inorganic films of a silicon oxide film ($SiO_x$), a silicon nitride film ($SiN_x$) and SiON, which are deposited alternately. The buffer film may be omitted.

The thin film transistor 210 is formed on the buffer film. The thin film transistor 210 includes an active layer 211, a gate electrode 212, a source electrode 213, and a drain electrode 214. Although the thin film transistor 210 is formed in a top gate mode in such a manner that the gate electrode 212 is arranged above the active layer 211 as shown in FIG. 5, it is to be understood that the thin film transistor of the present disclosure is not limited to the top gate mode. That is, the thin film transistor 210 may be formed in a bottom gate mode in which the gate electrode 212 is arranged below the active layer 211 or a double gate mode in which the gate electrode 212 is arranged both above and below the active layer 211.

The active layer 211 is formed on the buffer film. The active layer 211 may be formed of a silicon based semiconductor material or an oxide based semiconductor material. A light-shielding layer for shielding external light entering the active layer 211 may be formed between the buffer film and the active layer 211.

A gate insulating film 220 may be formed on the active layer 211. The gate insulating film 220 may be formed of an inorganic film, for example, a silicon oxide film ($SiO_x$), a silicon nitride film ($SiN_x$) or a multi-layered film of the silicon oxide film and the silicon nitride film.

The gate electrode 212 and the gate line may be formed on the gate insulating film 220. The gate electrode 212 and the gate line may be, but not limited to, a single layer or multi-layer comprised of any one of Mo, Al, Cr, Au, Ti, Ni, Nd or Cu or their alloy.

An inter-layer dielectric film 230 may be formed on the gate electrode 212 and the gate line. The inter-layer dielectric film 230 may be formed of an inorganic film, for example, a silicon oxide film ($SiO_x$), a silicon nitride film ($SiN_x$), or a multi-layered film of the silicon oxide film and the silicon nitride film.

The source electrode 213, the drain electrode 214 and the date line may be formed on the inter-layer dielectric film 230. Each of the source electrode 213 and the drain electrode 214 may be connected to the active layer 211 through a contact hole that passes through the gate insulating film 220 and the inter-layer dielectric film 230. Each of the source electrode 213, the drain electrode 214 and the data line may be, but not limited to, a single layer or multi-layer comprised of any one of Mo, Al, Cr, Au, Ti, Ni, Nd or Cu or their alloy.

A passivation film 240 may be formed on the source electrode 213, the drain electrode 214 and the data line to insulate the thin film transistor 210. The passivation film 240 may be formed of an inorganic film, for example, a silicon oxide film ($SiO_x$), a silicon nitride film ($SiN_x$), or a multi-layered film of the silicon oxide film and the silicon nitride film.

A planarization film 250 for planarizing a step height difference due to the thin film transistor 210 may be formed on the passivation layer 240. The planarization film 250 may be formed of an organic film such as acrylic resin, epoxy resin, phenolic resin, polyamide resin, and polyimide resin.

An organic light emitting diode 260 and a bank 270 are formed on the planarization film 250. The organic light emitting diode 260 includes a first electrode 261, an organic light emitting layer 262, and a second electrode 263. The first electrode 261 may be an anode electrode, and the second electrode 263 may be a cathode electrode.

The first electrode 261 may be formed on the planarization film 250. The first electrode 261 is connected to the source electrode 213 of the thin film transistor 210 through a contact hole that passes through the passivation film 240 and the planarization film 250. The first electrode 261 may be formed of a metal material having high reflectivity such as a deposition structure (Ti/Al/Ti) of Al and Ti, a deposition structure (ITO/Al/ITO) of Al and ITO, an APC alloy, and a deposition structure (ITO/APC/ITO) of APC alloy and ITO. The APC alloy is an alloy of Ag, Pd and Cu.

The bank 270 may be formed on the planarization film 250 to cover an edge of the first electrode 261, thereby partitioning the emission areas E1, E2, E3 and E4. That is, the bank 270 serves to define the emission areas. Also, since the area where the bank 270 is formed does not emit light, this area may be defined as a non-emission area. The bank 270 may be formed of an organic film such as acrylic resin, epoxy resin, phenolic resin, polyamide resin, and polyimide resin.

The organic light emitting layer 262 is formed on the first electrode 261 and the bank 270. The organic light emitting layer 262 is a common layer commonly formed on the emission areas E1, E2, E3 and E4, and may be a white light emitting layer emitting white light. In this case, the organic light emitting layer 262 may be formed in a tandem structure of two stacks or more. Each of the stacks may include a hole transporting layer, at least one light emitting layer, and an electron transporting layer.

Also, a charge generating layer may be formed between the stacks. The charge generating layer may include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer may be made of an organic layer doped with alkali metal such as Li, Na, K and Cs, or alkali earth metal such as Mg, Sr, Ba and Ra. The p type charge generating layer may be formed in such a manner that an organic material having hole transportation capability is doped with a dopant.

The second electrode 263 is formed on the organic light emitting layer 262. The second electrode 263 is a common layer commonly formed on the emission areas E1, E2, E3 and E4. The second electrode 263 may be formed of a transparent conductive material (TCO) such as ITO and IZO, which may transmit light, or a semi-transmissive conductive material such as Mg, Ag, and alloy of Mg and Ag. A capping layer may be formed on the second electrode 263.

An encapsulation film 280 is formed on the second electrode 263. The encapsulation film 280 serves to prevent $H_2O$ or $O_2$ from being permeated into the organic light emitting layer 262 and the second electrode 263. To this end, the encapsulation film 280 may include at least one inorganic film and at least one organic film.

For example, the encapsulation film 280 may include a first inorganic film 281, an organic film 282, and a second inorganic film 283. In this case, the first inorganic film 281 is formed to cover the second electrode 263. The organic film 282 is formed to cover the first inorganic film 281. The organic film 282 may be formed to have a sufficient thickness to prevent particles from being permeated into the organic light emitting layer 262 and the second electrode 263 by passing through the first inorganic film 281. The second inorganic film 283 is formed to cover the organic film 282.

Each of the first and second inorganic films 281 and 283 may be formed of a silicon nitride, an aluminum nitride, a zirconium nitride, a titanium nitride, a hafnium nitride, a tantalum nitride, a silicon oxide, an aluminum oxide, or a titanium oxide. The organic film 282 may be formed of acrylic resin, epoxy resin, phenolic resin, polyamide resin, or polyimide resin.

First to fourth color filters 291, 292, 293 and 294 may be formed on the encapsulation film 280. If the first to fourth color filters 291, 292, 293 and 294 are directly formed on the encapsulation film 280, it is not required to align the first substrate 111 and the second substrate 112 when the first substrate 111 and the second substrate 112 are bonded to each other, and a separate adhesive layer is not required.

In FIG. 5, the first color filter 291 is arranged to correspond to the first emission area E1, the second color filter 292 is arranged to correspond to the second emission area E2, the third color filter 293 is arranged to correspond to the third emission area E3, and the fourth color filter 294 is arranged to correspond to the fourth emission area E4.

In the pixels according to one aspect of the present disclosure, color filters of the same color are not arranged at adjacent pixels. Therefore, the first color filter 291 according to one aspect of the present disclosure may have a color different from those of the second color filter 292 and the fourth color filter 294, and may have the same color as that of the third color filter 293. Also, the second color filter 292 may have a color different from those of the first color filter 291 and the third color filter 293, and may have the same color as that of the fourth color filter 294.

The second color filter 292 and the fourth color filter 294 according to one aspect may be formed of organic films including green pigment, and the third color filter 293 may be formed of an organic film including blue pigment, and the first color filter 291 may be formed of an organic film including red pigment.

An inorganic film 310 is formed on the first to fourth color filters 291, 292, 293 and 294. That is, the inorganic film 310 is formed to cover a space on the first to fourth color filters 291, 292, 293 and 294 and the black matrix 300 as shown in FIG. 5. The inorganic film 310 may be formed of a transparent conductive material (TCO) such as ITO and IZO, or may be formed of a silicon oxide film ($SiO_x$), a silicon nitride film ($SiN_x$), or a multi-layered film of the silicon oxide film and the silicon nitride film.

The black matrix 300 is arranged on the encapsulation film 280 in the same manner as the color filters 291, 292, 293 and 294 and arranged among the first to fourth color filters 291, 292, 293 and 294. Since the black matrix 300 is formed on a non-emission area not the emission area EA, the black matrix 300 may be arranged to overlap the bank 270. The black matrix 300 may be formed of an organic film including black pigment.

The black matrix 300 is arranged to cover edges of the first color filter 291 and the third color filter 293. That is, the black matrix 300 is arranged to be in contact with upper ends of the first color filter 291 and the third color filter 293. The second color filter 292 and the fourth color filter 294 are arranged to be in contact with an upper end of the black matrix 300.

Therefore, in the display device according to one aspect of the present disclosure, the color filters 291, 292, 293 and 294 adjacent to one another are not in contact with one another, and the black matrix 300 is arranged between the color filters 291, 292, 293 and 294 adjacent to one another even though the color filters 291, 292, 293 and 294 adjacent to one another are overlapped with one another, whereby mixing of colors may be prevented from occurring.

In the sub pixels according to one aspect of the present disclosure as described above, the same structure is provided between the sub pixels which are not adjacent to each other, and a different structure is provided between the sub pixels adjacent to each other. Therefore, the display device according to one aspect of the present disclosure may prevent light passing through the color filters of different colors, which are arranged to adjoin each other, at one time from occurring, and picture image quality may be prevented from being deteriorated.

The second substrate 112 may be attached onto the first to fourth color filters 291, 292, 293 and 294 and the inorganic film 310. The second substrate 112 may be an encapsulation film.

Figure 6:
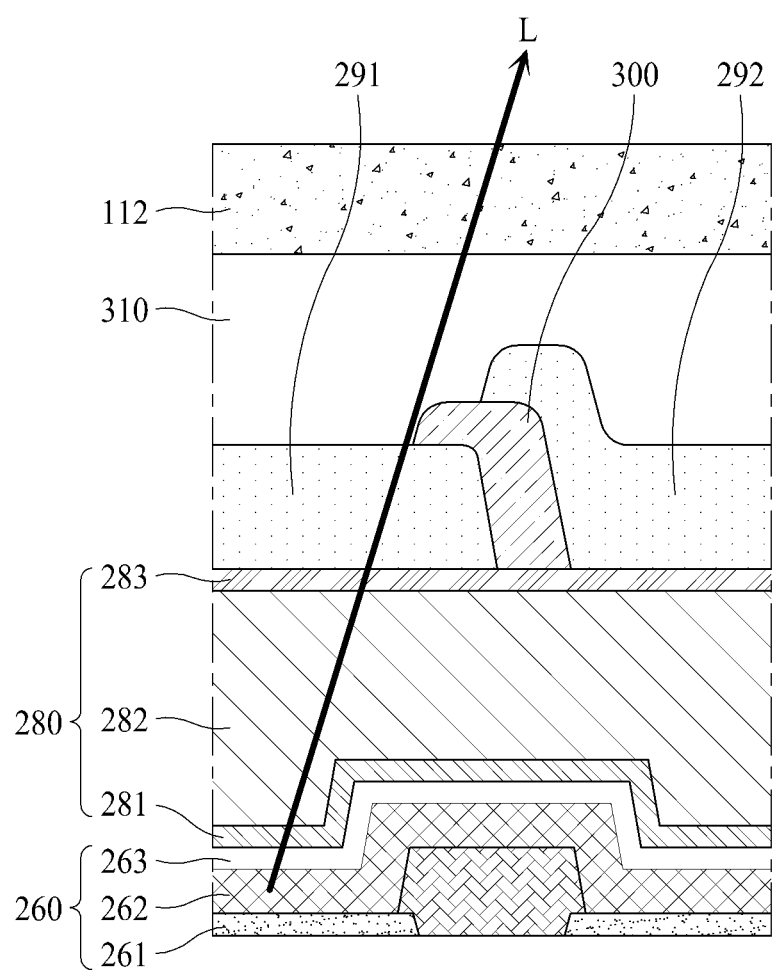
FIG. 6 is an enlarged view of FIG. 5, illustrating that light is transmitted.

FIG. 6 is an enlarged view of FIG. 5, illustrating that light is transmitted. For convenience of description, the organic light emitting diode 260, the bank 270, the encapsulation film 280, the first color filter 291, the second color filter 292, and the black matrix 300 are only shown in FIG. 6.

Referring to FIG. 6, the first color filter 291 is arranged on the encapsulation film 280 and arranged to correspond to the first emission area E1.

The black matrix 300 is arranged on the encapsulation film 280 to overlap the bank 270. The black matrix 300 is arranged between the first color filter 291 and the second color filter 192, and is arranged at an upper end of the first color filter 291 to cover an edge of the first color filter 291. Therefore, the black matrix 300 has a height higher than that of the first color filter 291.

The second color filter 292 is arranged on the encapsulation film 280, and is arranged at an upper end of the black matrix 300 to cover an edge of the black matrix 300. Therefore, the second color filter 292 has a height higher than that of the black matrix 300.

That is, in the display device according to one aspect of the present disclosure, the first color filter 291, the black matrix 300 and the second color filter 292 overlap one another in the area overlapping the bank 270. At this time, the first color filter 291 and the second color filter 292 may not overlap each other.

In the display device according to one aspect of the present disclosure as described above, the black matrix 300 is arranged to cover the edge of the first color filter 291, whereby light L emitted from the organic light emitting diode 260 and then passed through the first color filter 291 is prevented from entering the second color filter 292 or light L passed through the second color filter 292 is prevented from entering the first color filter 291. Therefore, in the display device according to one aspect of the present disclosure, even though color filters may be formed to overlap each other due to a compact pixel interval in a head mounted display of ultra-high resolution, mixing of colors in light L is prevented from occurring and picture image quality is prevented from being deteriorated.

Figure 7:
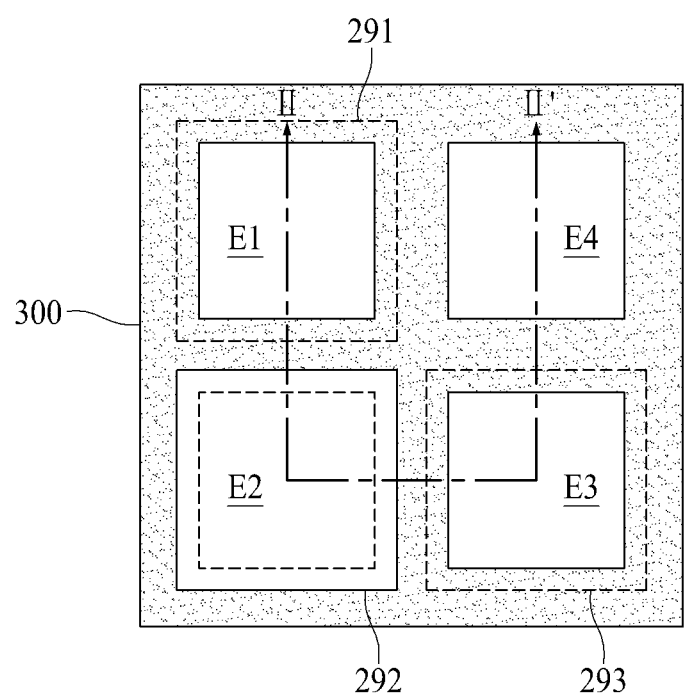
FIG. 7 is a plan view illustrating another example of pixels of a display area.
Figure 8:
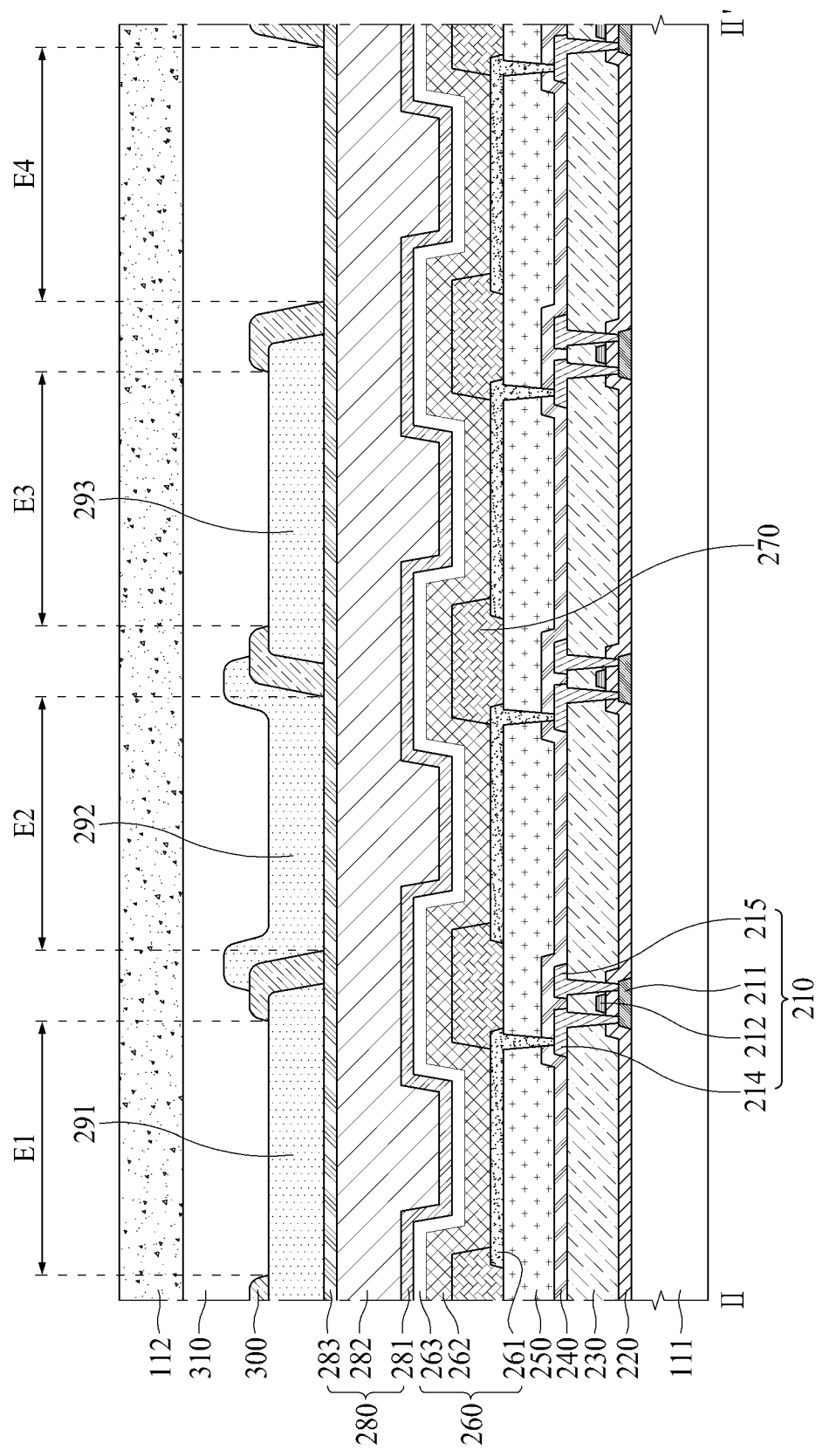
FIG. 8 is a cross-sectional view taken along line II-II' of FIG. 7.

FIG. 7 is a plan view illustrating another example of pixels of a display area, and FIG. 8 is a cross-sectional view taken along line II-II' of FIG. 7. The pixels shown in FIGS. 7 and 8 are substantially the same as those described with reference to FIGS. 4 to 6 except that no color filter is formed on the fourth emission area E4.

In the display device shown in FIGS. 7 and 8, no color filter is formed on the fourth emission area E4, and the fourth emission area E4 may be filled with the inorganic film 310, or a transparent organic film may be formed on the fourth emission area E4, whereby the fourth emission area E4 may emit white light. Therefore, in the display device according to another aspect of the present disclosure, a red sub pixel, a green sub pixel, a blue sub pixel, and a white sub pixel may be defined as one unit pixel.

Figure 9:
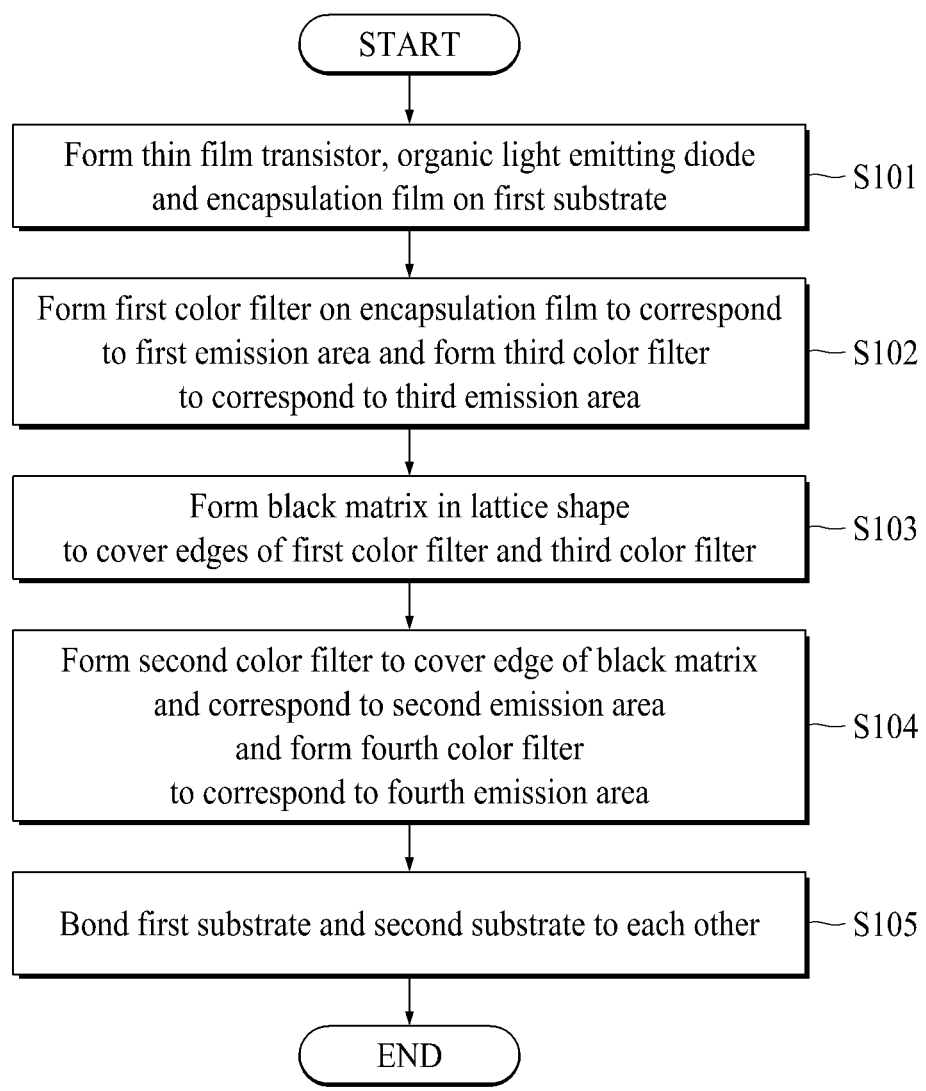
FIG. 9 is a flow chart illustrating a method for manufacturing a display device according to an aspect of the present disclosure.

FIG. 9 is a flow chart illustrating a method for manufacturing a display device according to one aspect of the present disclosure, and FIGS. 10A to 10E are cross-sectional views along line I-I' of FIG. 4, illustrating a method for manufacturing a display device according to one aspect of the present disclosure.

Since the cross-sectional views shown in FIGS. 10A to 10E relate to a method for manufacturing the aforementioned display device shown in FIGS. 4 and 5, the same reference numerals will be given to the same elements. Hereinafter, the method for manufacturing the display device according to one aspect of the present disclosure will be described with reference to FIGS. 10A to 10E.

Figure 10A:
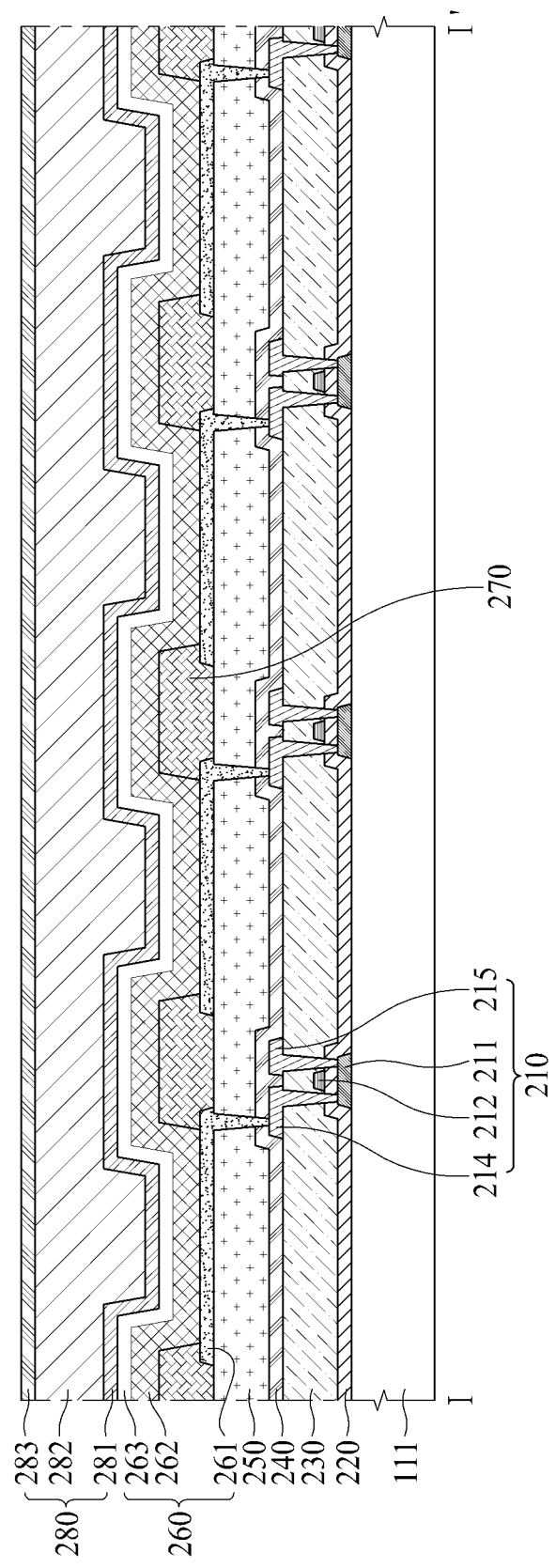
FIGS. 10A to 10E are cross-sectional views along line I-I', illustrating a method for manufacturing a display device according to an aspect of the present disclosure.

First of all, as shown in FIG. 10A, the thin film transistor 210, the organic light emitting diode 260, and the encapsulation film 270 are formed on the first substrate 111.

In more detail, the buffer film may be formed on the first substrate 111. The buffer film may be formed to protect the thin film transistor 210 and the organic light emitting diode 260 from water permeated through the first substrate 111 which is vulnerable to moisture permeability, and may be made of a plurality of inorganic films which are deposited alternately. For example, the buffer film may be formed of a multi-layered film of one or more inorganic films of a silicon oxide film ($SiO_x$), a silicon nitride film ($SiN_x$) and SiON, which are deposited alternately. The buffer film may be formed by a chemical vapor deposition (CVD).

Then, the active layer 211 of the thin film transistor is formed on the buffer film. In more detail, an active metal layer is formed on the entire surface of the buffer film by sputtering or metal organic chemical vapor deposition (MOCVD). Afterwards, the active metal layer is patterned by a mask process using a photoresist pattern to form the active layer 211. The active layer 211 may be formed of a silicon based semiconductor material or an oxide based semiconductor material.

Then, the gate insulating film 220 is formed on the active layer 211. The gate insulating film 220 may be formed of an inorganic film, for example, a silicon oxide film ($SiO_x$), a silicon nitride film ($SiN_x$), or a multi-layered film of the silicon oxide film and the silicon nitride film.

Then, the gate electrode 212 of the thin film transistor 210 is formed on the gate insulating film 220. In more detail, a first metal layer is formed on an entire surface of the gate insulating film 220 by sputtering or metal organic chemical vapor deposition (MOCVD). Afterwards, the first metal layer is patterned by a mask process using a photoresist pattern to form the gate electrode 212. The gate electrode 212 may be formed of a single layer or multi-layer comprised of any one of Mo, Al, Cr, Au, Ti, Ni, Nd or Cu or their alloy.

Afterwards, the inter-layer dielectric film 230 is formed on the gate electrode 212. The inter-layer dielectric film 230 may be formed of an inorganic film, for example, a silicon oxide film ($SiO_x$), a silicon nitride film ($SiN_x$), or a multi-layered film of the silicon oxide film and the silicon nitride film.

Then, the contact holes for exposing the active layer 211 are formed to pass through the gate insulating film 220 and the inter-layer dielectric film 230.

Then, the source and drain electrodes 213 and 214 of the thin film transistor 210 are formed on the inter-layer dielectric film 230. In more detail, a second metal layer is formed on an entire surface of the inter-layer dielectric film 230 by sputtering or MOCVD. Then, the second metal layer is patterned by a mask process using a photoresist pattern to form the source and drain electrodes 213 and 214. Each of the source and drain electrodes 213 and 214 may be formed of a single layer or multi-layer comprised of any one of Mo, Al, Cr, Au, Ti, Ni, Nd or Cu or their alloy.

Then, the passivation film 240 is formed on the source and drain electrodes 213 and 214 of the thin film transistor 210. The passivation film 240 may be formed of an inorganic film, for example, a silicon oxide film ($SiO_x$), a silicon nitride film ($SiN_x$), or a multi-layered film of the silicon oxide film and the silicon nitride film. The passivation film 240 may be formed by CVD.

Then, the planarization film 250 for planarizing a step height difference caused by the thin film transistor 210 is formed on the passivation film 240. The planarization film 250 may be formed of an organic film such as acrylic resin, epoxy resin, phenolic resin, polyamide resin, and polyimide resin.

Then, the first electrode 261 of the organic light emitting diode 260 is formed on the planarization film 250. In more detail, a third metal layer is formed on an entire surface of the planarization film 280 by sputtering or MOCVD. Then, the third metal layer is patterned by a mask process using a photoresist pattern to form the first electrode 261. The first electrode 261 may be connected to the source electrode 213 of the thin film transistor 210 through a contact hole that passes through the passivation film 240 and the planarization film 250. The first electrode 261 may be formed of a metal material having high reflectivity such as a deposition structure (Ti/Al/Ti) of Al and Ti, a deposition structure (ITO/Al/ITO) of Al and ITO, an APC alloy, and a deposition structure (ITO/APC/ITO) of the APC alloy and ITO.

Then, the bank 270 is formed on the planarization film 250 to cover the edge of the first electrode 261, thereby partitioning the emission areas E1, E2, E3 and E4. The bank 270 may be formed of an organic film such as acrylic resin, epoxy resin, phenolic resin, polyamide resin, and polyimide resin.

Then, the organic light emitting layer 282 is formed on the first electrode 261 and the bank 270 by a deposition process or solution process. The organic light emitting layer 262 may be a common layer commonly formed on the emission areas E1, E2, E3 and E4. In this case, the organic light emitting layer 262 may be formed of a white light emitting layer emitting white light.

If the organic light emitting layer 262 is a white light emitting layer, the organic light emitting layer 262 may be formed in a tandem structure of two stacks or more. Each of the stacks may include a hole transporting layer, at least one light emitting layer, and an electron transporting layer.

Also, a charge generating layer may be formed between the stacks. The charge generating layer may include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer may be made of an organic layer doped with alkali metal such as Li, Na, K and Cs, or alkali earth metal such as Mg, Sr, Ba and Ra. The p type charge generating layer may be formed in such a manner that an organic material having hole transportation capability is doped with a dopant.

Then, the second electrode 263 is formed on the organic light emitting layer 262. The second electrode 263 may be a common layer commonly formed on the emission areas E1, E2, E3 and E4. The second electrode 263 may be formed of a transparent conductive material (TCO) such as ITO and IZO, which may transmit light, or a semi-transmissive conductive material such as Mg, Ag, or alloy of Mg and Ag. The second electrode 263 may be formed by a physical vapor deposition such as sputtering. A capping layer may be formed on the second electrode 263.

Then, the encapsulation film 280 is formed on the second electrode 263. The encapsulation film 280 serves to prevent $H_2O$ or $O_2$ from being permeated into the organic light emitting layer 262 and the second electrode 263. To this end, the encapsulation film 280 may include at least one inorganic film and at least one organic film.

For example, the encapsulation film 280 may include a first inorganic film 281, an organic film 282, and a second inorganic film 283. In this case, the first inorganic film 281 is formed to cover the second electrode 263. The organic film 282 is formed to cover the first inorganic film 281. The organic film 282 may be formed to have a sufficient thickness to prevent particles from being permeated into the organic light emitting layer 262 and the second electrode 263 by passing through the first inorganic film 281. The second inorganic film 283 is formed to cover the organic film 282.

Each of the first and second inorganic films 281 and 283 may be formed of a silicon nitride, an aluminum nitride, a zirconium nitride, a titanium nitride, a hafnium nitride, a tantalum nitride, a silicon oxide, an aluminum oxide, or a titanium oxide. The organic film 282 may be formed of acrylic resin, epoxy resin, phenolic resin, polyamide resin, or polyimide resin (S101 of FIG. 9).

Figure 10B:
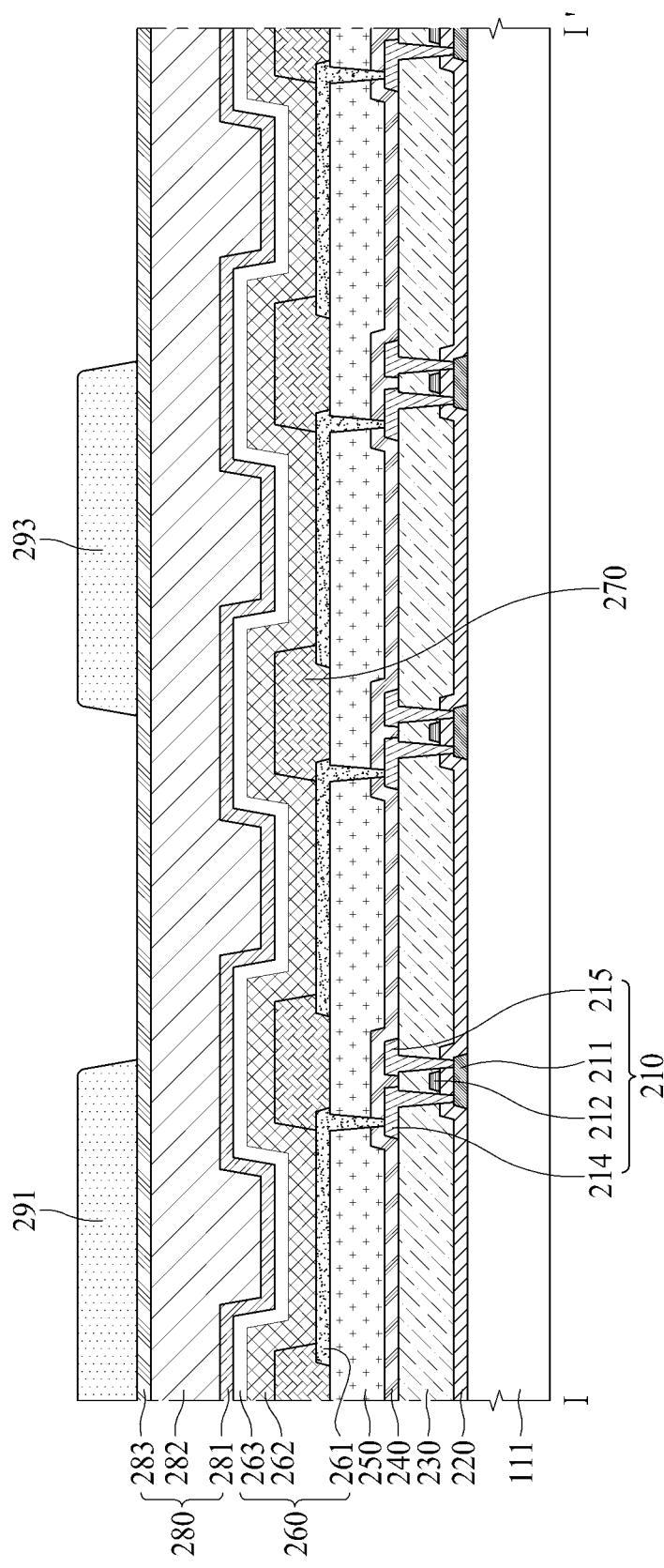
Figure 10C:
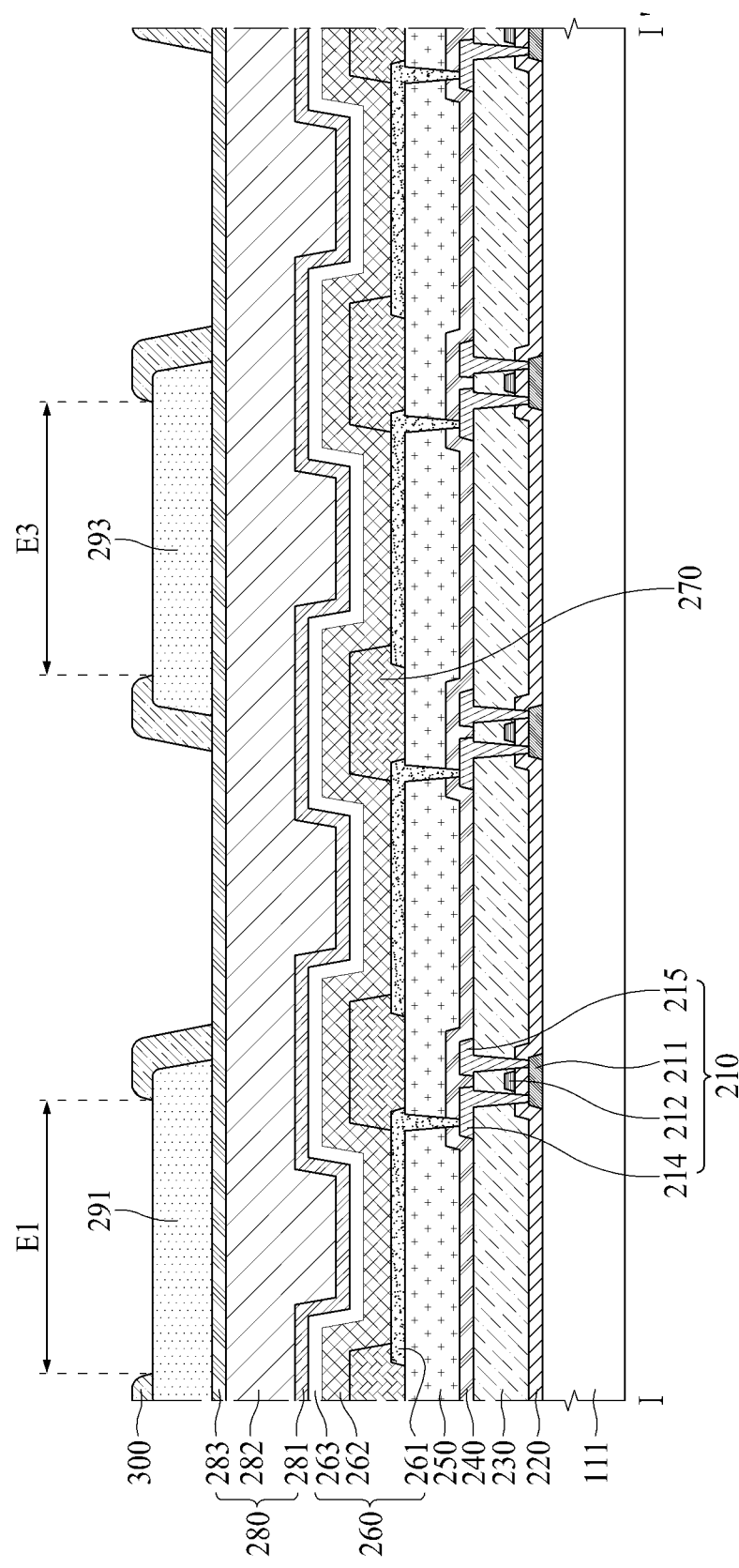

Secondly, as shown in FIG. 10B, the first color filter 291 is arranged to correspond to the first emission area E1, and the third color filter 293 is arranged to correspond to the third emission area E3.

For example, the first color filter 291 may be a red color filter, and the third color filter 293 may be a blue color filter. In more detail, an organic material including red pigment is deposited on the encapsulation film 280, and a photo process is performed to form the first color filter 291 on the first emission area E1. Then, an organic material including blue pigment is deposited on the encapsulation film 280, and a photo process is performed to form the third color filter 293 on the third emission area E3 (S102 of FIG. 9).

Thirdly, the black matrix 300 is formed in a lattice shape to cover the edges of the first color filter 291 and the third color filter 293. The black matrix 300 may be an organic material including black pigment. Since the black matrix 300 is formed on a non-emission area not the emission area, the black matrix 300 may be arranged to overlap the bank 270 (S103 of FIG. 9).

Figure 10D:
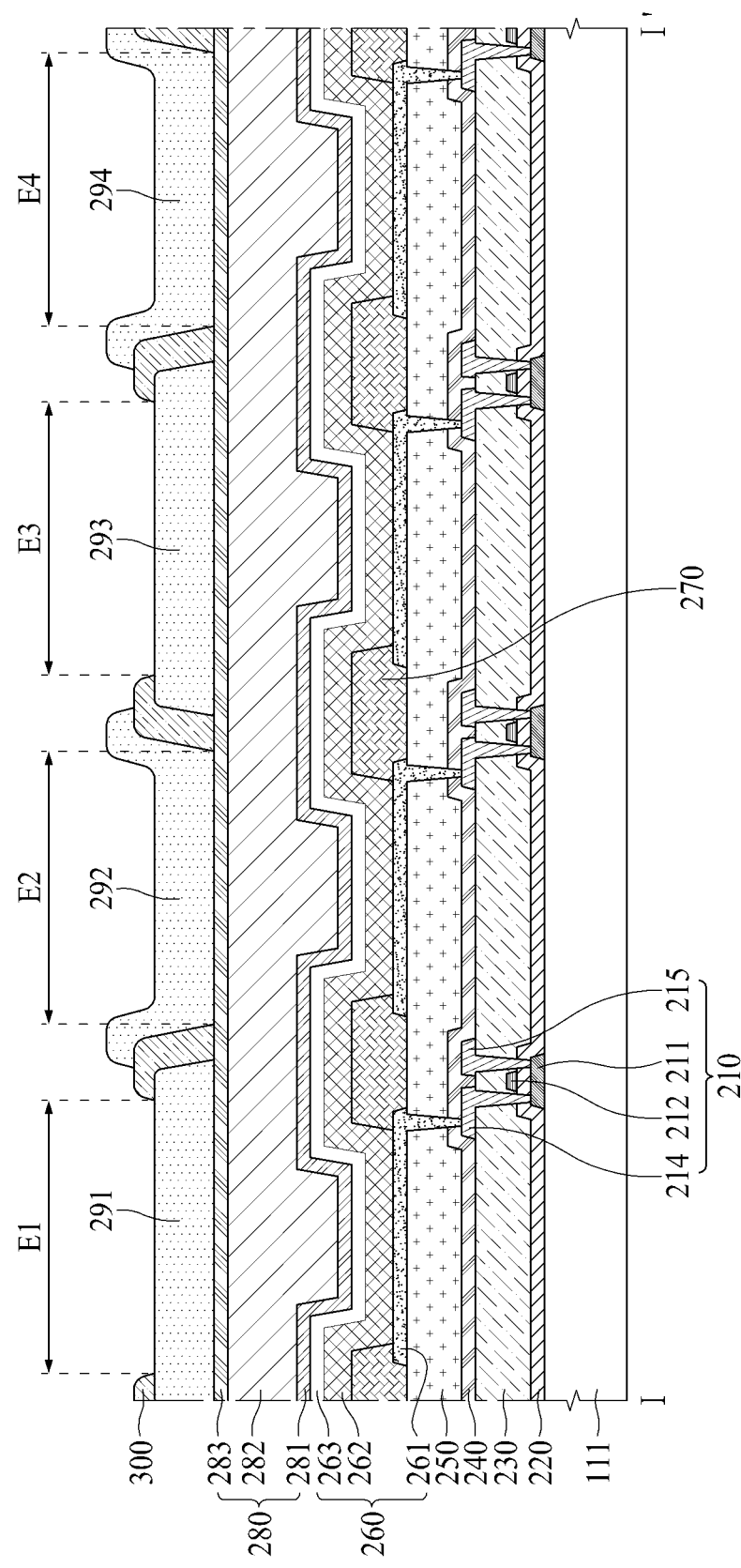

Fourthly, as shown in FIG. 10D, the second color filter 292 is formed on the encapsulation film E2 to correspond to the second emission area E2, and the fourth color filter 294 is arranged to correspond to the fourth emission area E4.

For example, the second color filter 292 and the fourth color filter 294 may be green color filters. In more detail, an organic material including green pigment is deposited on the edges of the encapsulation film 280 and the black matrix 300, and a photo process is performed to form the second color filter 292 and the fourth color filter 294 on the second emission area E2 and the fourth emission area E4.

Meanwhile, if a transparent organic film is formed on the second emission area E2 or the fourth emission area E4 or nothing is formed thereon, the second emission area or the fourth emission area may be used as a white sub pixel. The transparent organic film may be formed of acrylic resin, epoxy resin, phenolic resin, polyamide resin, or polyimide resin (S104 of FIG. 9).

Figure 10E:
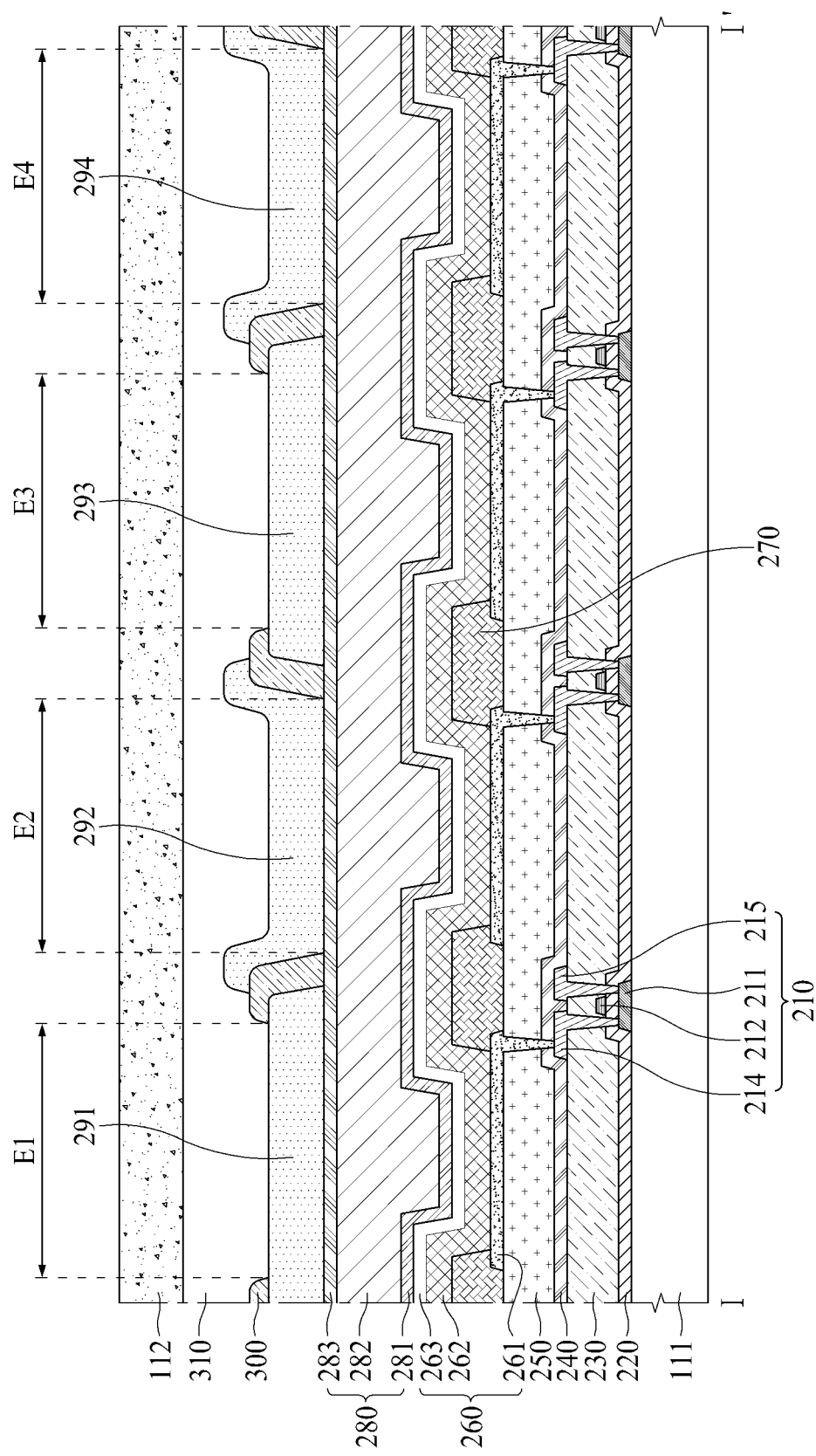

Fifthly, as shown in FIG. 10E, the inorganic film 310 is formed on the first to fourth color filters 291, 292, 293 and 294.

The inorganic film 310 may be formed of a transparent conductive material (TCO) such as ITO and IZO, or may be formed of a silicon oxide film (SiOx), a silicon nitride film (SiNx), or a multi-layered film of the silicon oxide film and the silicon nitride film. If the inorganic film 310 is formed of a transparent metal material, the inorganic film 310 may be formed by sputtering method. If the inorganic film 310 is formed of a silicon oxide film (SiOx), a silicon nitride film (SiNx), or a multi-layered film of the silicon oxide film and the silicon nitride film, the inorganic film 310 may be formed by CVD method.

Then, the second substrate 112 is bonded onto the inorganic film 310. The second substrate 112 may be an encapsulation film (S105 of FIG. 9).

Meanwhile, the process of forming the first to fourth color filters 291, 292, 293 and 294, the inorganic film 310 and the black matrix 310 as shown in FIGS. 10A to 10E is the process of forming them on the encapsulation film 280 that covers the organic light emitting diode 260, the process may be a low temperature process of 100° C. or less to prevent the organic light emitting diode 260 from being damaged.

Also, although the second color filter 292 and the fourth color filter 294 are formed as green color filters, the third color filter 293 is formed as a blue color filter and the first color filter 291 is formed as a red color filer in the steps S102 and S104, the present disclosure may be applied to all the cases except that color filters of the same color are formed between the pixels adjacent to each other, without limitation to the steps S102 and S104.

Figure 11:
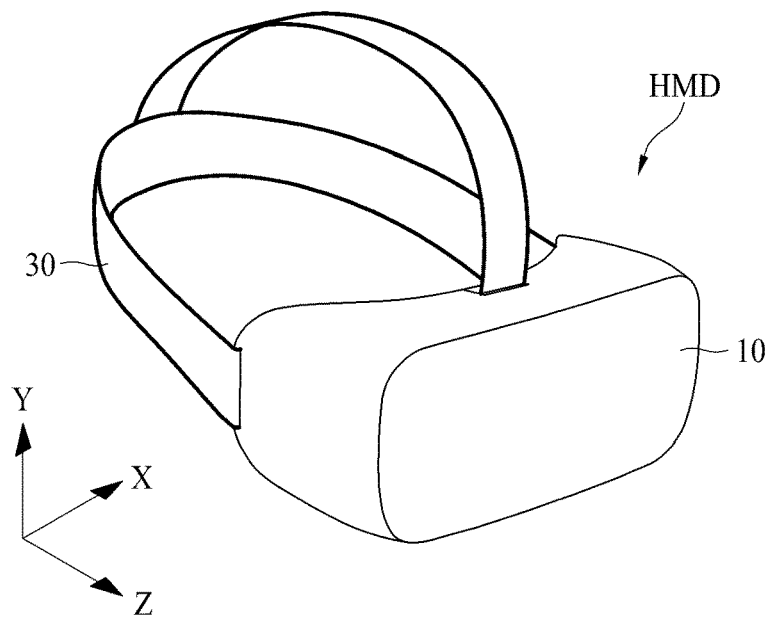
FIGS. 11 to 14 are exemplary views illustrating a head mounted display according to an aspect of the present disclosure.
Figure 12:
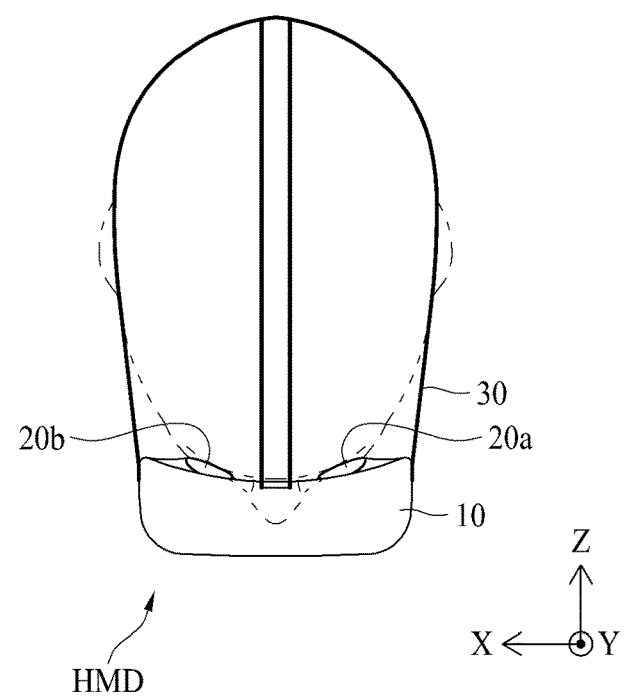

FIGS. 11 and 12 are exemplary views illustrating a head mounted display according to an aspect of the present disclosure.

Referring to FIGS. 11 and 12, a head mounted display (HMD) according to an aspect of the present disclosure includes a display receiving case 10, a left-eye lens 20a, a right-eye lens 20b, and a head mounted band 30.

The display receiving case 10 accommodates the display device, and provides an image of the display device to the left-eye lens 20a and the right-eye lens 20b. The display device may be an organic light emitting display device according to an aspect of the present disclosure. The organic light emitting display device according to an aspect of the present disclosure has been described in detail with reference to FIGS. 2 to 10E.

The display receiving case 10 may be designed to provide the same image to the left-eye lens 20a and the right-eye lens 20b. Alternatively, the display receiving case 10 may be designed such that a left-eye image is displayed on the left-eye lens 20a and a right-eye image is displayed on the right-eye lens 20b.

Figure 13:
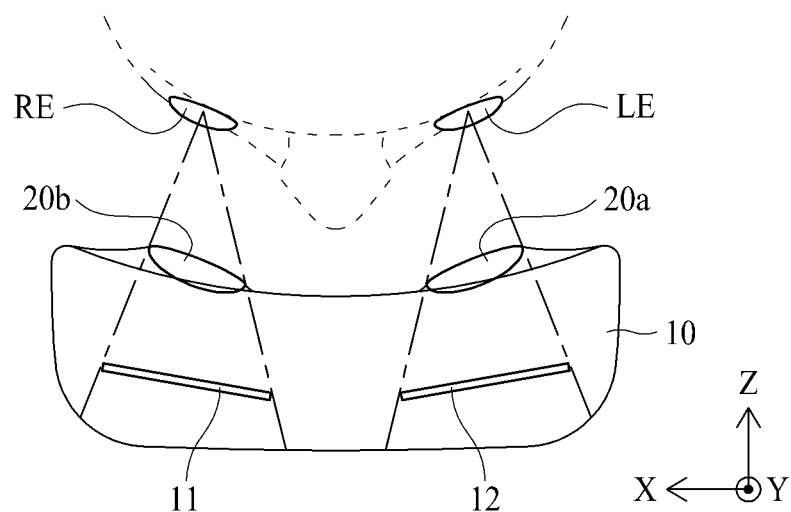

A left-eye organic light emitting display device 11 arranged in front of the left-eye lens 20a and a right-eye organic light emitting display device 12 arranged in front of the right-eye lens 20b may be received in the display receiving case 10 as shown in FIG. 13. A cross-sectional view of the display receiving case 10 viewed from above is shown in FIG. 13. The left-eye organic light emitting display device 11 may display a left-eye image, and the right-eye organic light emitting display device 12 may display a right-eye image. For this reason, the left-eye image displayed on the left-eye organic light emitting display device 11 may be seen to a left-eye LE of a user through the left-eye lens 20a, and the right-eye image displayed on the right-eye organic light emitting display device 12 may be seen to a right-eye RE of the user through the right-eye lens 20b.

Also, a magnifying lens may additionally be arranged between the left-eye lens 20a and the left-eye organic light emitting display device 11 and between the right-eye lens 20b and the right-eye organic light emitting display device 12. In this case, the image displayed on the left-eye organic light emitting display device 11 and the right-eye organic light emitting display device 12 may be seen to the user at a magnified state due to the magnifying lens.

Figure 14:
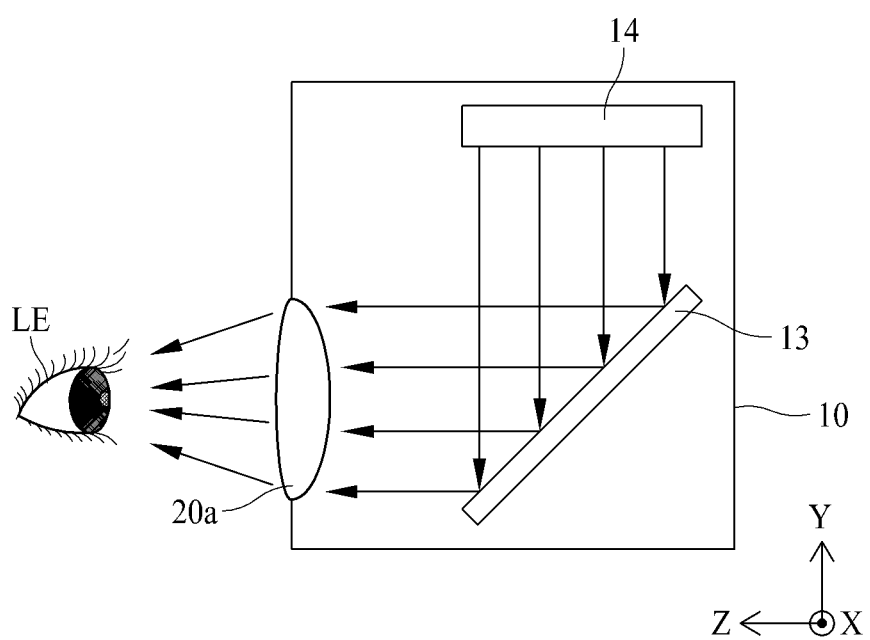

A mirror reflective plate 13 arranged in front of the left-eye lens 20a and the right-eye lens 20b and an organic light emitting display device 14 arranged on the mirror reflective plate 13 may be received in the display receiving case 10 as shown in FIG. 14. A sectional view of the display receiving case 10 viewed from side is shown in FIG. 14. The organic light emitting display device 14 displays an image in a direction of the mirror reflective plate 13, and the mirror reflective plate 13 totally reflects the image of the organic light emitting display device 14 in a direction of the left-eye lens 20a and the right-eye lens 20b. For this reason, the image displayed on the organic light emitting display device 14 may be provided to the left-eye lens 20a and the right-eye lens 20b. For convenience of description, the left-eye lens 20a and the left-eye LE of the user are only shown in FIG. 14. If the mirror reflective plate 13 is used as shown in FIG. 14, the display receiving case 10 may be formed thinly.

Also, a magnifying lens may additionally be arranged between the left-eye lens 20a and the mirror reflective plate 13 and between the right-eye lens 20b and the mirror reflective plate 13. In this case, the image displayed on the left-eye organic light emitting display device 11 and the right-eye organic light emitting display device 12 may be seen to the user at a magnified state due to the magnifying lens.

The head mounted band 30 is fixed to the display receiving case 10. The head mounted band 30 formed to surround a top surface and both sides of a head of the user is illustrated but not limited to this example. The head mounted band 30 is intended to fix the head mounted display to the head of the user, and may be formed in the form of glasses frame or helmet.

Meanwhile, in case of the head mounted display of the related art, one or more color filters may be formed to overlap each other due to a compact pixel interval, and light may transmit an area where the color filters are formed to overlap each other, whereby mixing of colors may occur. However, in the head mounted display according to an aspect of the present disclosure, the black matrix 300 is arranged to cover the edge of the second color filter 292, whereby light L emitted from the organic light emitting diode 260 and then passed through the second color filter 292 may be prevented from entering the first color filter 291 or light L passed through the first color filter 291 may be prevented from entering the second color filter 292. Therefore, in the head mounted display according to an aspect of the present disclosure, even though color filters may be formed to overlap each other due to a compact pixel interval in a head mounted display of ultra-high resolution, mixing of colors in light L may be prevented from occurring and picture image quality may be prevented from being deteriorated.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. Thus, the above aspects are to be considered in all respects as illustrative and not restrictive. The scope of the disclosure should be determined by reasonable interpretation of the appended claims and all change which comes within the equivalent scope of the disclosure are included in the scope of the disclosure.

What is claimed is:

1. A display device comprising:
    a first color filter having an edge that includes a side surface facing an adjacent color filter and an upper surface facing a first emission area;
    a black matrix covering the side surface and the upper surface of the edge of the first color filter;
    a second color filter adjacent to the first color filter, having a color different from that of the first color filter, and having an upper surface facing a second emission area; and
    a third color filter having a color different from those of the first and second color filters, adjacent to the second color filter, having an edge that includes a side surface facing an adjacent color filter and an upper surface facing a third emission area and having the side surface and the upper surface of the edge covered by the black matrix,
    wherein the black matrix contacts the side surface and the upper surface of the edge of the first color filter and the side surface and the upper surface of the edge of the third color filter,
    wherein the second color filter includes a first portion facing the second emission area and a second portion extending from and above the first portion up onto the black matrix and the edge of the first color filter, and
    wherein the black matrix covering the upper surface of the edge of the first color filter has a first height higher than that of the first color filter, and the second portion of the second color filter has a second height higher than that of the black matrix covering the upper surface of the edge of the first color filter.

2. The display device of claim 1, wherein the black matrix is arranged between the first color filter and the second color filter.

3. The display device of claim 1, wherein the first color filter is separated apart from the second color filter.

4. The display device of claim 1, wherein the black matrix has a height higher than that of the third color filter.

5. The display device of claim 1, further comprising a unit pixel including first to fourth emission areas, wherein the first emission area corresponds to the first color filter, the second and fourth emission areas correspond to the second color filter, and the third emission area corresponds to the third color filter.

6. The display device of claim 5, wherein the first emission area and the third emission area are arranged along a first diagonal direction, and the second emission area and the fourth emission area are arranged along a second diagonal direction crossing the first diagonal direction.

7. The display device of claim 1, further comprising a unit pixel including first to fourth emission areas, wherein the first emission area corresponds to the first color filter, the second emission area corresponds to the second color filter, the third emission area corresponds to the third color filter, and no color filter is arranged on the fourth emission area.

8. The display device of claim 1, wherein the first and second color filters do not overlap each other to a direction of light emitted from an organic light emitting diode of the display device.

9. The display device of claim 8, wherein the black matrix is configured to block the light passing through the second color filter.

10. A head mounted display comprising:
    a display device comprising a first color filter having an edge that includes a side surface facing an adjacent color filter and an upper surface facing a first emission area, a black matrix covering the side surface and the upper surface of the edge of the first color filter; a second color filter adjacent to the first color filter, having an edge that includes a side surface facing an adjacent color filter and an upper surface facing a second emission area, having a color different from that of the first color filter and covering an edge of the black matrix which covers the edge of the first color filter; and a third color filter having a color different from those of the first and second color filters, adjacent to the second color filter, having an edge that includes a side surface facing an adjacent color filter and an upper surface facing a third emission area and having the side surface and the upper surface of the edge covered by the black matrix, wherein the black matrix contacts the side surface and the upper surface of the edge of the first color filter and the side surface and the upper surface of the edge of the third color filter, wherein the second color filter includes a first portion facing the second emission area and a second portion extending from and above the first portion up onto the black matrix and the edge of the first color filter, and wherein the black matrix covering the upper surface of the edge of the first color filter has a first height higher than that of the first color filter, and the second portion of the second color filter has a second height higher than that of the black matrix covering the upper surface of the edge of the first color filter;

a display receiving case accommodating the display device; and a lens arranged at one side of the display receiving case, providing an image of the display device.

11. The display device of claim 10, wherein the black matrix is arranged between the first color filter and the second color filter.

12. The display device of claim 10, wherein the first color filter is separated apart from the second color filter.

13. The display device of claim 10, wherein the black matrix has a height higher than that of the third color filter.

14. The display device of claim 10, further comprising a unit pixel including first to fourth emission areas, wherein the first emission area corresponds to the first color filter, the second and fourth emission areas correspond to the second color filter, and the third emission area corresponds to the third color filter.

15. The display device of claim 14, wherein the first emission area and the third emission area are arranged along a first diagonal direction, and the second emission area and the fourth emission area are arranged along a second diagonal direction crossing the first diagonal direction.

16. The display device of claim 10, further comprising a unit pixel including first to fourth emission areas, wherein the first emission area corresponds to the first color filter, the second emission area corresponds to the second color filter, the third emission area corresponds to the third color filter, and no color filter is arranged on the fourth emission area.

17. The display device of claim 10, wherein the black matrix is configured to block the light passing through the second color filter.

18. A method for manufacturing a display device, comprising:

forming a thin film transistor, an organic light emitting diode and an encapsulation film on a first substrate;

forming a first color filter on the encapsulation film and having an edge that includes a side surface facing an adjacent color filter and an upper surface facing a first emission area;

forming a third color filter on the encapsulation film and having an edge that includes a side surface facing an adjacent color filter and an upper surface facing a third emission area;

forming a black matrix to cover the side surface and the upper surface of the edge of the first color filter and the third color filter; and forming a second color filter having an edge that includes a side surface facing the first color filter and an upper surface facing a second emission area covering an edge of the black matrix which covers the edge of the first color filter and the third color filter, wherein the black matrix contacts the side surface and the upper surface of the edge of the first color filter and the side surface and the upper surface of the edge of the third color filter and wherein the second color filter includes a first portion facing the second emission area and a second portion extending from and above the first portion up onto the black matrix and the edge of the first color filter, and wherein the black matrix covering the upper surface of the edge of the first color filter has a first height higher than that of the first color filter, and the second portion of the second color filter has a second height higher than that of the black matrix covering the upper surface of the edge of the first color filter.

19. A display device comprising:

a first color filter having a middle portion and an edge portion, wherein the middle portion faces a first emission area and the edge portion includes a side surface facing an adjacent color filter;

a second color filter adjacent to the first color filter, having a color different from that of the first color filter, the second color filter including a middle portion facing a second emission area and an edge portion;

a third color filter having a color different from those of the first and second color filters, the third color filter having a middle portion and an edge portion, wherein the middle portion faces a third emission area and the edge portion includes a side surface facing the second color filter; and a black matrix covering the edge portion of the first color filter and the edge portion of the third color filter, wherein the edge portion of the second color filter extends from and above the middle portion of the second color filter and overlaps the black matrix and the edge portion of the first color filter and the edge portion of the third color filter, and wherein the black matrix has a first height higher than that of the first color filter, and the second portion of the second color filter has a second height higher than that of the black matrix covering the edge portion of the first color filter and the edge portion of the third color filter.

* * * * *